(12) United States Patent
Plontke et al.

(10) Patent No.: US 6,635,884 B2
(45) Date of Patent: Oct. 21, 2003

(54) METHOD FOR DIRECTING AN ELECTRON BEAM ONTO A TARGET POSITION ON A SUBSTRATE SURFACE

(75) Inventors: Rainer Plontke, Magdala (DE); Ines Stolberg, Jena (DE); Michael Blume, Jena (DE); Rainer Kaebsch, Rothenstein (DE); Matthias Zierbock, Graitschen (DE)

(73) Assignee: Leica Microsystems Lithography GmbH, Jena (DE)

( * ) Notice: Subject to any disclaimer, the term of this patent is extended or adjusted under 35 U.S.C. 154(b) by 229 days.

(21) Appl. No.: 09/797,860

(22) Filed: Mar. 5, 2001

(65) Prior Publication Data

US 2001/0028039 A1 Oct. 11, 2001

(30) Foreign Application Priority Data

Mar. 8, 2000 (DE) .......................................... 100 11 202

(51) Int. Cl.$^7$ ............................................. H01J 37/304
(52) U.S. Cl. ...................................... 250/427; 250/311
(58) Field of Search ................... 250/311, 427, 250/442.11, 398, 400, 310

(56) References Cited

U.S. PATENT DOCUMENTS

| 5,864,142 | A | * | 1/1999 | Muraki et al. ........... 250/491.1 |
| 5,939,725 | A | * | 8/1999 | Muraki ................... 250/492.22 |
| 5,965,895 | A | * | 10/1999 | Satoh et al. ............. 250/491.1 |
| 6,207,965 | B1 | * | 3/2001 | Koike ..................... 250/492.23 |
| 6,373,070 | B1 | * | 4/2002 | Rasmussen ............ 250/492.21 |
| 6,437,347 | B1 | * | 8/2002 | Hartley et al. ........... 250/491.1 |

OTHER PUBLICATIONS

W. Bruenger et al., "Low Energy Lithography; Energy Control and Variable Energy Exposure", *Microelectronic Engineering 27*, ©Elsevier Science B.V., pp. 135–138, (1995).

* cited by examiner

*Primary Examiner*—John R. Lee
*Assistant Examiner*—Anthony Quash
(74) *Attorney, Agent, or Firm*—Foley & Lardner

(57) ABSTRACT

The invention refers to the field of electron beam lithography, in particular to a method for directing an electron beam (6) onto a target position (Z) on the surface of a substrate, the substrate first being placed onto a movable stage (2) and the stage (2) then being displaced stepwise, in the X and/or Y coordinates of a Cartesian grid, until the target position (Z) is located at a spacing from the impact point (P) of the undeflected electron beam (6) which is smaller than the smallest step distance of the stage displacement system, and then the electron beam (6) is directed onto the target position (Z) by deflection.

This results in a considerable increase in positioning accuracy in electron beam lithography. Positioning accuracies on the order of 0.1 nm to 0.05 are achievable. The method is suitable in particular for writing grating patterns in which the spacing between the individual grating lines must be maintained with high accuracy.

6 Claims, 3 Drawing Sheets

METHOD FOR DIRECTING AN ELECTRON BEAM ONTO A TARGET POSITION ON A SUBSTRATE SURFACE

CROSS REFERENCE TO RELATED APPLICATIONS

This invention claims priority of a German patent application DE 100 11 202.1 which is incorporated by reference herein.

FIELD OF THE INVENTION

The invention refers to the field of electron beam lithography, in particular to a method for directing the electron beam onto a target position on the surface of a substrate, the substrate first being placed onto a movable stage (2) and the stage then being displaced stepwise, in the X and/or Y coordinates of a Cartesian grid, into predefined positions.

BACKGROUND OF THE INVENTION

Methods of this kind are used in order to write linear or planar patterns onto the radiation-sensitive resist layer of substrates, which can then be used, for example, as phase masks for chip manufacture.

In conventional methods, the electron beam is directed onto the target position either by converting location information about the target point into a deflection of the electron beam, or by shifting a stage that carries the substrate and is movable in stepwise fashion.

An apparatus for electron beam lithography in which the substrate is positioned by means of a stage with respect to an approximately stationary electron beam is known, for example, from Microelectronic Engineering 27 (1995) 135–138. This apparatus allows a positioning accuracy for the stage, and thus for the target position relative to the electron beam, of approximately 10 nm to 2.5 nM. A further increase in the positioning accuracy of the stage is possible only with considerable outlay in terms of precision equipment.

In practice, however, in specific cases the positioning accuracies that are required lie beyond the accuracies attainable, even with the greatest effort, using a stage movable in stepwise fashion. One example of such a case is the production of phase masks for chirped Bragg gratings (or fiber Bragg gratings), which require positioning accuracies of at least 0.1 nm to 0.05 nm; this accuracy must moreover be available over a displacement range of approximately 150 mm.

In a grating of this kind having a grating period of 1 $\mu$m and a width of 100 mm, 100,000 parallel grating lines must be applied in a highly accurate arrangement with respect to one another. The special feature of chirped gratings is that the spacing between the last two grating lines must be, for example, 0.5 run greater than the spacing between the first two grating lines. In addition, the spacing between adjacent grating lines must increase linearly from the first two grating lines to the last two grating lines. Theoretically, this means that the spacing between two adjacent grating line pairs must increase by 0.005 pm in each case. This difference is on the order of a fraction of an atomic diameter, and thus cannot be realized with physical equipment.

Given the large number of grating lines, however, the exact position of the grating lines is not important, since the grating acts collectively. Instead, the real position of the grating lines can fluctuate statistically about the theoretical reference position with no immediate risk of thereby losing the overall functionality of the grating. Assuming a Gaussian distribution for the fluctuation, even 1$\sigma$ values of less than 2 nm would be entirely permissible.

The functionality of the chirped grating is lost, however, if systematic deviations in the position of the grating lines occur, or if many grating lines are offset by the same magnitude.

Theoretical calculations have indicated that sufficient functionality in a chirped grating can just be achieved if the grating is broken down into line packets of no more than 200 grating lines each, and if the average grating constant from one packet to another then decreases by the value that would result, under the above circumstances, for 200 lines, namely by 1 pm ($10^{-12}$ m) in this case. This change can be effected if, in each successive packet, the spacing of only one line pair is decreased by one step or one increment of a positioning system used to produce it. The step distance or increment of the positioning system would then need to be approximately 0.2 nm. This is not achievable, however, with previously known apparatuses for electron beam lithography.

To produce a grating having the aforementioned functionality, it is also known to divide it first into a plurality of working fields arranged one behind another, each of which has a predefined number of grating lines, for example 500 grating lines for a field size of 500 $\mu$m. The working fields are then scaled in size, the difference in size between two adjacent working fields being approximately 1.25 nm. In a grating of this kind, all the lines in one working field theoretically have the same spacing. At the transition to an adjacent working field, i.e. every 500 lines, the line spacing theoretically jumps by a value of 2.5 pm.

The principal problem here is accurate assembly of the working fields one behind another, since the assembly accuracy of conventional apparatuses for electron beam lithography lies in the nanometer range. Assembly errors between the working fields become perceptible, however, as systematic errors due to higher-order structures in the grating. Additional systematic deformations of the grating result from residual distortions of the working field, so that the deformations repeat with the periodicity of the working fields.

SUMMARY OF THE INVENTION

Proceeding therefrom, it is the object of the invention further to improve positioning accuracy in electron beam lithography.

This object is achieved with a method for directing an electron beam onto a target position on the surface of a substrate in which firstly the substrate is placed onto a stage that is movable in stepwise fashion in the X and Y coordinates in a Cartesian grid, then the stage is displaced until the target position is located at a spacing from the impact point of the undeflected electron beam which is smaller than the smallest step distance of the stage displacement system, and then the electron beam is directed onto the target position by deflection.

By distributing the position adjustment between two positioning system, i.e. positioning firstly with the stage displacement system and secondly with the beam deflection system, the method according to the present invention makes it possible to achieve accuracies of up to 0.05 nm. With it, a grating having the functionality of the chirped Bragg grating described above can be configured on a substrate without difficulty and with high quality.

The method according to the present invention is not limited to the manufacture of this kind of grating. Rather it is suitable for all applications in which extreme precision in establishing the target point on the substrate surface is important. A preferred field of application is the writing of linear or planar patterns for phase masks. The method can also be used for direct exposure of such patterns on semiconductor substrates.

Distribution of the positioning task between two serially arranged positioning systems furthermore allows the use of a conventionally operated substrate stage for coarse adjustment of the target position, which is physically separate from the fine adjustment by means of deflection of the electron beam. Despite the increase in positioning accuracy, the equipment outlay can thus be kept relatively low.

The step distance of the movable stage preferably lies in the range from 1 nm to 10 nm and in particularly preferred fashion is 2.5 nm, i.e. it lies within the accuracy range of conventional apparatuses for electron beam lithography, which thus can easily be expanded, by appropriate configuration of the system controller, to include the method according to the present invention.

In an advantageous embodiment, the deflection of the electron beam is scaled to a range of ±3 $\mu$m to ±6 $\mu$m. The deflection range of the electron beam is thus confined to a very narrow subregion on the substrate in which, with a moderate hardware outlay, a very high addressing and working accuracy for precision positioning is then available. The positioning accuracy is achieved in both coordinates (X and Y) of the motion plane of the stage, so that even non-straight-line patterns can be written very accurately. For very high-accuracy addressing of the target position, it is also conceivable to scale the deflection range to the step distance of one individual increment of the stage.

For writing parallel grating lines, in an embodiment that is particularly advantageous for that purpose the stage is moved stepwise in the X and Y coordinates of a plane. In this context, the deflection of the electron beam is scaled in a range of ±3 $\mu$m to ±6 $\mu$m in only one of the X or Y coordinates. This allows the particularly sensitive spacing of the grating lines from one another to be established with high accuracy. On the other hand, the outlay remains low for the less critical setting of changes in the target position in the longitudinal direction of the grating lines once the line spacing (i.e. the coordinate transverse to the grating lines) has been set. The time required to write the grating can also be kept short. Lines are written in their longitudinal direction simply by shifting the stage in the relevant coordinate X or Y.

In an alternative embodiment, on the other hand, deflection of the electron beam is also implemented in the longitudinal direction of the grating lines and is then, in the interest of efficient hardware utilization and a rapid writing rate, preferably scaled in that coordinate to a larger range of ±18 $\mu$m to ±180 $\mu$m.

In a further advantageous embodiment of the invention, the deflection of the electron beam is performed with a resolution of 16 bits. This allows a rapid switchover to be effected between differently scaled deflection ranges of the electron beam, a finer resolution in path magnitudes being achieved as the deflection ranges become smaller. As a consequence, even very accurately calculated target positions can be converted into a correspondingly precise deflection signal for the electron beam.

BRIEF DESCRIPTION OF THE DRAWINGS

The invention will be explained in further detail below with reference to exemplary embodiments depicted in the drawings, in which.

DETAILED DESCRIPTION OF THE INVENTION

Figure 1:
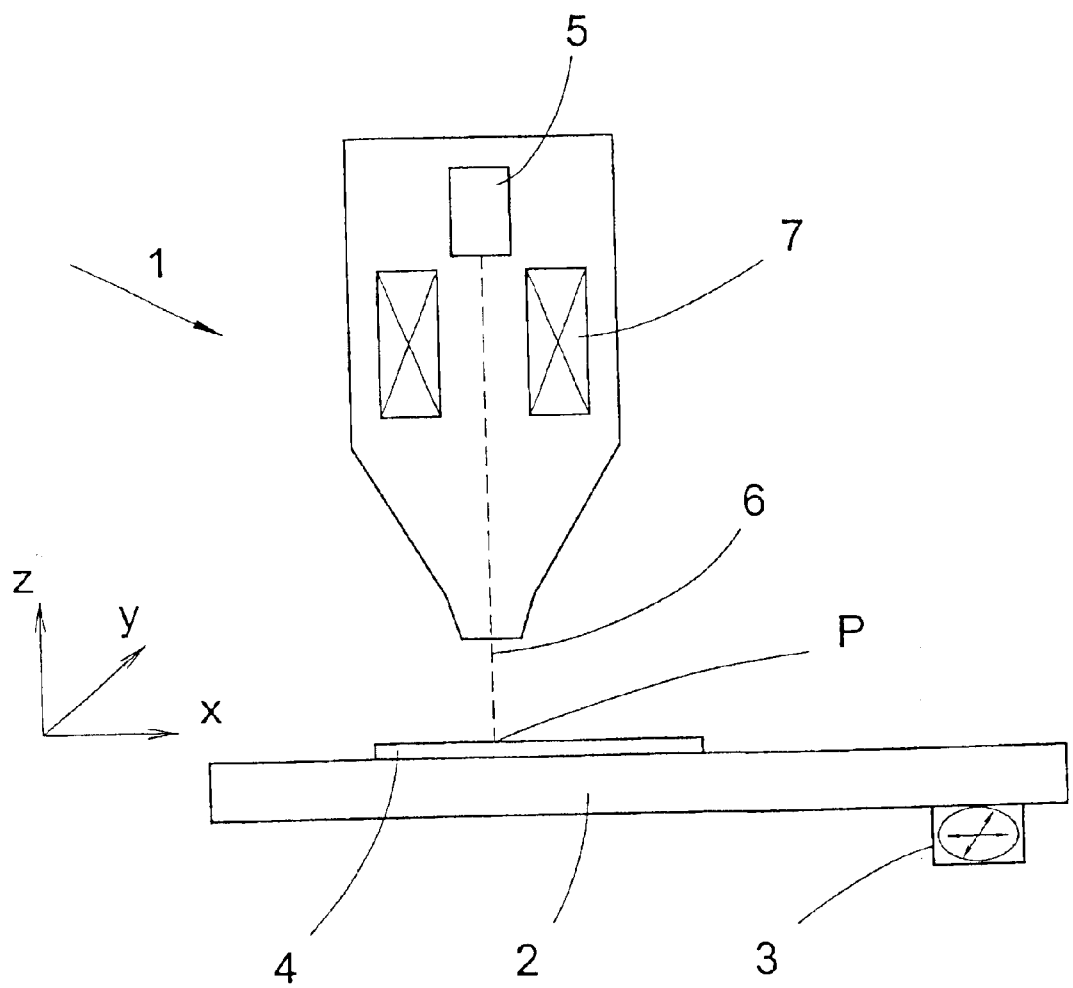
FIG. 1 shows a schematic depiction of an apparatus for electron beam lithography.

In FIG. 1, apparatus 1 for electron beam lithography comprises a stage, movable in the X and Y coordinate directions, for holding a planar substrate 4 that extends predominantly in the X-Y plane. Stage 2 is displaceable in stepwise fashion in the X coordinate and the Y coordinate via an associated feed device 3, in order to position the substrate relative to an electron beam. The individual feed steps or individual increments for each of the coordinate directions X and Y are on the order of 1 nm to 10 nm. The feed rate is approximately 1 mm/s. In the exemplary embodiment selected, an individual step distance of 2.5 nm is used.

Apparatus 1 for electron beam lithography further comprises an electron radiation source 5 which directs a collimated electron beam 6 at a substantially constant radiation density, in the direction of the Z coordinate perpendicular to the plane spanned by the X and Y coordinates, onto stage 2 and substrate 4. Electron radiation source 5 is, for example, a field emission cathode that is notable for a highly constant radiation density of the emitted electron beam 6.

Associated with electron radiation source 5 is an electromagnetic deflection device 7 for deflecting electron beam 6. With this, electron beam 6 can be deflected both in the direction of the X coordinate and in the direction of the Y coordinate. FIG. 1 shows electron beam 6 in its undeflected orientation, perpendicular to the surface of substrate 4 and the surface of stage 2.

Figure 2:
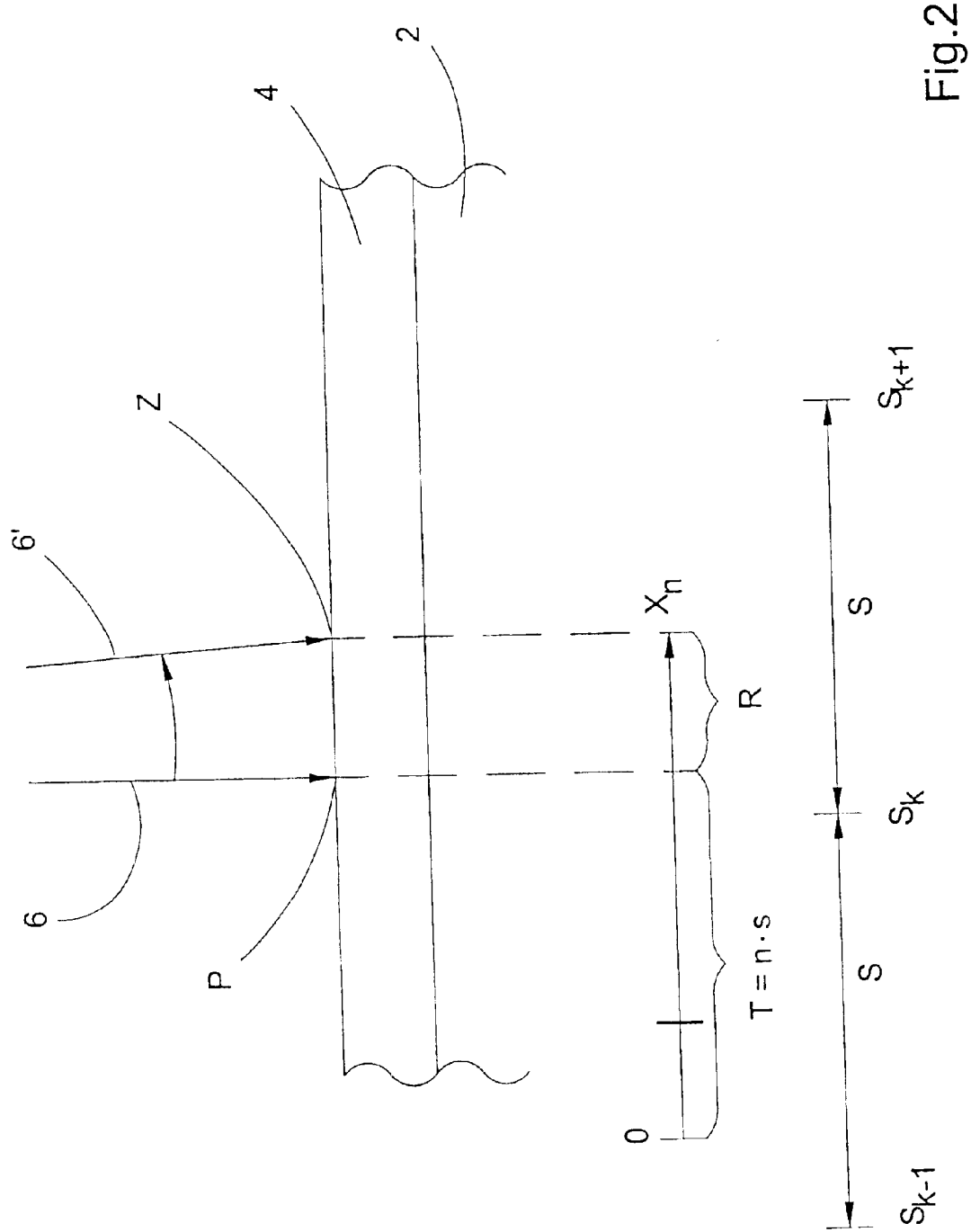
FIG. 2 shows an enlarged depiction of the vicinity of the impact point of the electron beam on the substrate.

Conditions around the impact point of electron beam 6 on the surface of substrate 4 are depicted in detail in FIG. 2. As already explained, stage 2 is displaceable stepwise in each of its coordinate directions X and Y. FIG. 2 illustrates the displacement possibilities in the direction of the X coordinate, the individual incrementing points of feed device 3 for stage 2 in the X direction being labeled $S_K$, K being an integral numerical index. The increment between directly adjacent incrementing points, i.e. the step distance s of feed apparatus 3 in the X direction, is constant. As mentioned above, in this case it is 2.5 nm.

Impact point P of electron beam 6 on the surface of substrate 4 is movable by means of deflection apparatus 7 at least over the step distance s of one individual step of feed device 3. For fine positioning of impact point P in a target point Z on substrate 4, the entire resolution of deflection device 7 is scaled onto a small surface region so as to yield a resolution of 0.1 nm or even 0.05 nm.

In the exemplary embodiments depicted, deflection device 7 is activated with 16-bit resolution. With the path lengths cited above for that resolution, the result at the substrate surface is then a deflection range of ±6 $\mu$m or ±3 $\mu$m. A deflection of electron beam 6 out of the undeflected position into a deflected position (indicated in FIG. 2 with the reference character 6') can consequently be addressed and established with high precision.

In order to direct electron beam 6 onto a target point Z on the surface of substrate 4, let it be assumed first that a coordinate system relative to stage 2 has been established on substrate 4, and furthermore that the path length $X_n$ of a displacement component in the direction of the X coordinate in the relative coordinates of substrate 4 is known. For the known path length $X_1$, the closest integral multiple T of step distance s of stage feed device 3 is then determined. The residual distance R between the path length $X_n$ and the integral multiple T of step distance s is also determined. The applicable equations are:

$$X_n = T + R$$

and $$T = n*s$$

where n stands for the number of individual steps.

On this basis, feed device 3 of stage 2 is advanced the resulting number n of individual steps s, so that impact point P of the undeflected electron beam 6 is then located at the smallest possible distance from the actual target position Z. The residual distance R is then compensated for by means of deflection device 7, by a stepwise fine adjustment of the electron beam. In the exemplary embodiment depicted, one individual increment of deflection device 7 is 0.1 nm or 0.05 nm, depending on scaling. A prerequisite for such resolution is, of course, that the positions of target points Z be calculated with at least corresponding accuracy.

In the procedure described above, the undeflected electron beam 6 is deflected through both positive and negative angles in order to effect fine positioning of impact point P in target point Z on the substrate surface. The maximum distance R in the X coordinate that needs to be compensated for is then limited to half of one individual step of stage feed device 3.

In a variant embodiment it is also possible, when distributing the path length $X_n$ that is to be established, always to ascertain the next-smaller integral multiple T of the step distance s, and then to determine the residual distance R based on that. In this case the maximum deflection of electron beam 6 corresponds to a migration of impact point P equaling one step distance s of stage positioning device 3. The deflection of electron beam 6 for fine adjustment is then, however, always performed in the same direction. In addition, a calculation algorithm for determining the next-smaller value T is somewhat shorter than an algorithm for determining the closest value T.

In a further variant embodiment, it is also possible always to proceed from the next-larger integral multiple T of the individual step length of feed device 3; the residual distance R then requires a deflection of electron beam 6 in the opposite direction.

Figure 3:
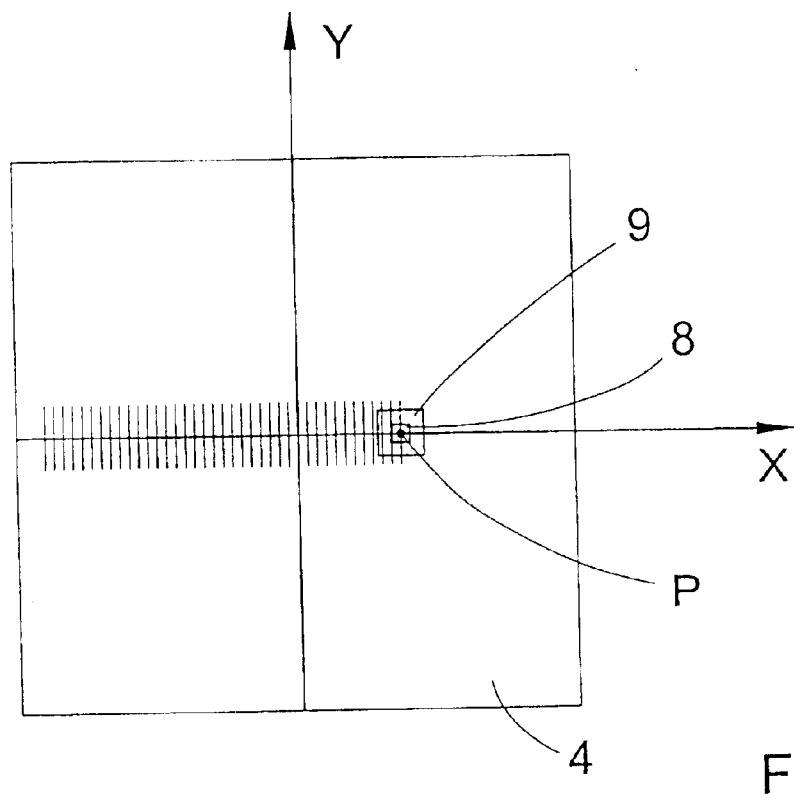
FIG. 3 illustrates a first method for writing a grating onto a substrate.

FIG. 3 illustrates a procedure for writing grating lines onto a substrate 4. Here the individual grating lines each extend parallel to the Y coordinate, and are arranged in parallel fashion one behind another in the X direction.

In order to write a grating line, first the X coordinate of the line in question is traveled to, for which purpose a feed operation of stage 2 is first performed in the manner explained above. In the exemplary embodiment shown in FIG. 3, the movement range of stage 2 is approximately ±80 mm in each of the two coordinate directions X and Y. This movement region is resolved, for each coordinate, into individual steps with a step length of 2.5 nm.

The remaining distance R to the X value of the target position of the grating line in question is established by means of deflection device 7. The deflection range of the electron beam is depicted in FIG. 3 by field 8 around impact point P of the undeflected electron beam 6. Here the field size is ±3 μm or ±6 μm, depending on scaling, in both coordinate directions X and Y.

After positioning in the X direction, stage 2 with substrate 4 is displaced by means of feed device 3 in the Y direction in order to write the grating line. In this context, stage 2 moves through beneath electron beam 6 which is held stationary, to a first approximation, in the Y direction. Any deviations in the real position of stage 2 or substrate 4 from the theoretical reference position are measured, for example with a laser interferometer, and conveyed to a beam tracking system with which any deviations that occur are compensated for by an additional deflection of electron beam 6. Stage feed device 3 and the beam tracking system form a self-contained unit, the individual components being calibrated to one another. In FIG. 3, the deflection range of the beam tracking system is illustrated by field 9, which in this exemplary embodiment is ±18 μm for a resolution of 2.5 nm.

Once a grating line has been written, substrate 4 is offset in the direction of the X coordinate. The next grating line can then be written.

Figure 4:
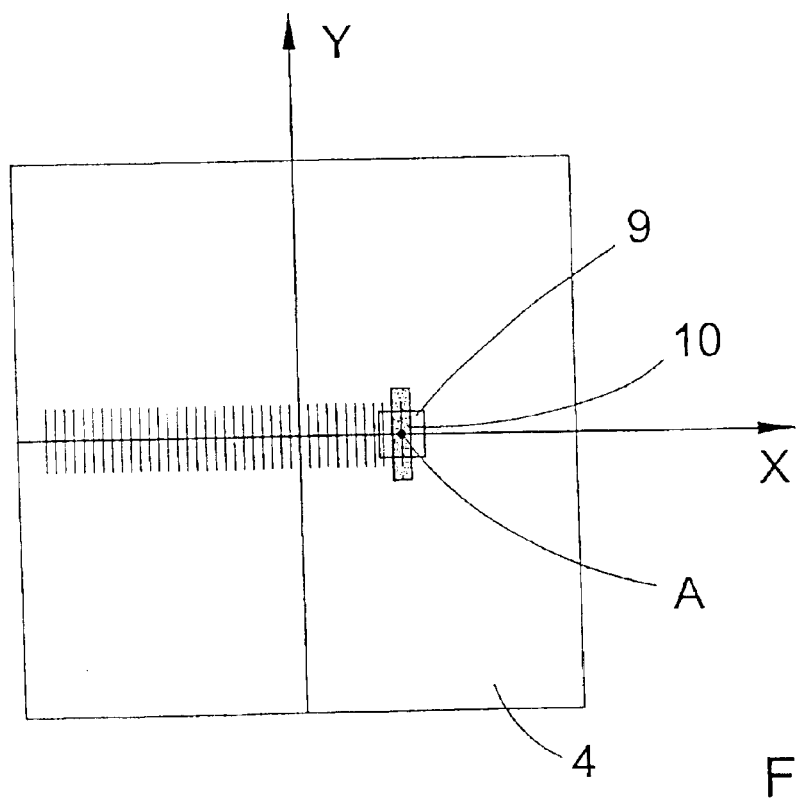
FIG. 4 illustrates a further method for writing a grating onto a substrate.

A further procedure will now be explained briefly with reference to FIG. 4. This differs from the procedure described in conjunction with FIG. 3 substantially in that now, in order to generate a relative motion in the Y coordinate between electron beam 6 and substrate 4, stage 2 with substrate 4 is not moved, but rather electron beam 6 is deflected in the Y direction for that purpose. The deflection range of deflection device 7 is then scaled in the Y direction to approximately the length of one grating line, for example ±90 μm, whereas in the X direction a scaling on the aforementioned order of ±3 μm to ±6 μm is maintained. The result is, in FIG. 4, an elongated rectangular field 10 for the deflection range of deflection device 7; be it noted here that in FIG. 3 and FIG. 4, the depiction of the grating lines and of fields 8 through 10 is not to scale.

Here as well, any deviations in the real position of substrate 4 or stage 2 are compensated for by a beam tracking system that acts on electron beam 6 and additionally deflects it. In order to write a further line, firstly its new X coordinate is established in the manner explained above. The actual writing of the line is then accomplished by a deflection of electron beam 6 in the Y direction.

With both procedures, the grating lines are written almost continuously one after another, so that, for example, the problems explained earlier with the assembly of working fields arranged one behind another are completely eliminated. Because of the separate control of the target points and the consistently high positioning accuracy (on the order of as little as 0.05 nm), the occurrence of systematic positional deviations can be greatly reduced.

The methods described above are suitable in particular for writing gratings with parallel lines, the different accuracy requirements along the grating lines (i.e. in the Y direction) and transverse to the grating lines (i.e. in the X direction) being exploited in order to minimize addressing and positioning complexity. It is also possible, however, for the positioning task to be distributed between two respectively serially arranged positioning systems not only in the X direction but also in the Y direction, for which purpose the procedure in the Y direction is the same as has been explained here with reference to FIG. 2 concerning the X direction.

Parts List

1 Apparatus for electron beam lithography
2 Stage

3 Feed device
4 Substrate
5 Electron radiation source
6 Electron beam
7 Deflection device
8 Field
9 Field
10 Field
k Numerical index
s Step distance
X, Y Coordinates
R Distance
P Impact point
Z Target position
T Integral multiple
$X_n$ Path length

What is claimed is:

1. A method for directing an electron beam onto a target position on the surface of a substrate in electron beam lithography, comprising:

placing the substrate onto a movable stage;

displacing the stage stepwise, in the X and/or Y coordinates of a Cartesian grid, until the target position is located at a spacing from the impact point of an undeflected electron beam which is smaller than the smallest step distance of the stage displacement system; and directing the electron beam onto the target position by deflection.

2. The method as defined in claim 1, wherein the displacement of the stage in the X and Y coordinates is performed with step distances in the range from 1 nm to 10 nm.

3. The method as defined in claim 1, wherein the deflection of the electron beam is scaled to a range of ±3 µm to ±6 µm.

4. The method as defined in claim 1, wherein the deflection of the electron beam is scaled in one of the coordinates X or Y to a range of ±3 µm to ±6 µm, and in the respective other coordinate to a range of ±18 µm to ±180 µm.

5. The method as defined in claim 1, wherein the deflection of the electron beam is performed with a resolution of 16 bits.

6. The method as defined in claim 2, wherein the displacement of the stage in the X and Y coordinates is performed with a step distance of about 2.5 nm.

* * * * *